(12) United States Patent
Orlowski et al.

(10) Patent No.: US 8,633,515 B2
(45) Date of Patent: Jan. 21, 2014

(54) TRANSISTORS WITH IMMERSED CONTACTS

(75) Inventors: Marius K. Orlowski, Austin, TX (US);
James D. Burnett, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/613,614

(22) Filed: Sep. 13, 2012

(65) Prior Publication Data

US 2013/0009222 A1 Jan. 10, 2013

Related U.S. Application Data

(62) Division of application No. 13/105,484, filed on May 11, 2011, now Pat. No. 8,314,448, which is a division of application No. 11/311,587, filed on Dec. 16, 2005, now Pat. No. 7,968,394.

(51) Int. Cl.
*H01L 29/66* (2006.01)

(52) U.S. Cl.
USPC .................. 257/192; 257/245; 257/278

(58) Field of Classification Search
None
See application file for complete search history.

(56) References Cited

U.S. PATENT DOCUMENTS

| | | | |
|---|---|---|---|
| 4,960,723 A | 10/1990 | Davies | |
| 5,155,052 A | 10/1992 | Davies | |
| 5,308,778 A | 5/1994 | Fitch et al. | |
| 5,578,873 A | 11/1996 | Manning | |
| 5,729,055 A | 3/1998 | Manning | |
| 5,795,793 A | 8/1998 | Kinzer | |
| 5,843,796 A | 12/1998 | Disney | |
| 5,874,341 A | 2/1999 | Gardner et al. | |
| 5,891,776 A | 4/1999 | Han et al. | |
| 5,910,668 A | 6/1999 | Disney | |
| 6,130,121 A | 10/2000 | Sze | |
| 6,204,518 B1 * | 3/2001 | Adan et al. | 257/67 |
| 6,248,620 B1 | 6/2001 | Strack et al. | |
| 6,300,683 B1 | 10/2001 | Nagasaka et al. | |
| 6,316,817 B1 | 11/2001 | Seliskar et al. | |
| 6,410,392 B1 | 6/2002 | Sogo | |
| 6,720,619 B1 | 4/2004 | Chen et al. | |

(Continued)

FOREIGN PATENT DOCUMENTS

| | | |
|---|---|---|
| JP | 62030394 | 2/1987 |
| JP | 63137941 | 9/1988 |

(Continued)

OTHER PUBLICATIONS

Anil, et al., Layout Density Analysis of FinFETs, ESSDERC Conference Proceedings 2003, pp. 139-142.

(Continued)

*Primary Examiner* — David E Graybill
(74) *Attorney, Agent, or Firm* — Sherry W. Schumm; David G. Dolezal (57) ABSTRACT

Embodiments of a semiconductor structure include a first current electrode region, a second current electrode region, and a channel region. The channel region is located between the first current electrode region and the second current electrode region, and the channel region is located in a fin structure of the semiconductor structure. A carrier transport in the channel region is generally in a horizontal direction between the first current electrode region and the second current electrode region. A contact extends into the first current electrode region and is electrically coupled to the first current electrode region.

17 Claims, 8 Drawing Sheets

(56) References Cited

U.S. PATENT DOCUMENTS

| | | | |
|---|---|---|---|
| 6,903,967 B2 | 6/2005 | Mathew et al. | |
| 6,969,656 B2 | 11/2005 | Du et al. | |
| 7,018,876 B2 | 3/2006 | Mathew et al. | |
| 7,075,820 B2 * | 7/2006 | Yamada et al. | 365/174 |
| 7,163,851 B2 * | 1/2007 | Abadeer et al. | 438/157 |
| 7,192,876 B2 | 3/2007 | Mathew et al. | |
| 7,211,864 B2 | 5/2007 | Seliskar | |
| 7,238,601 B2 | 7/2007 | Mathew et al. | |
| 7,279,375 B2 | 10/2007 | Radosavljevic et al. | |
| 7,282,766 B2 | 10/2007 | Okuno | |
| 7,384,838 B2 | 6/2008 | Hsu et al. | |
| 7,439,139 B2 | 10/2008 | Seliskar | |
| 7,518,196 B2 | 4/2009 | Chau et al. | |
| 7,638,842 B2 * | 12/2009 | Currie et al. | 257/347 |
| 7,719,058 B2 * | 5/2010 | Seliskar | 257/348 |
| 7,968,409 B2 * | 6/2011 | Seliskar | 438/284 |
| 2001/0003063 A1 | 6/2001 | Hu et al. | |
| 2004/0036118 A1 * | 2/2004 | Abadeer et al. | 257/347 |
| 2004/0169213 A1 | 9/2004 | Farrar | |
| 2004/0207791 A1 | 10/2004 | Lee et al. | |
| 2004/0235300 A1 | 11/2004 | Methew et al. | |
| 2005/0056892 A1 | 3/2005 | Seliskar | |
| 2005/0057964 A1 | 3/2005 | Mathew et al. | |
| 2005/0077569 A1 | 4/2005 | Yamashita et al. | |
| 2005/0124120 A1 | 6/2005 | Du et al. | |
| 2005/0141262 A1 * | 6/2005 | Yamada et al. | 365/149 |
| 2005/0151166 A1 | 7/2005 | Lin et al. | |
| 2005/0184292 A1 * | 8/2005 | Kwak et al. | 257/70 |
| 2005/0266638 A1 | 12/2005 | Cho et al. | |
| 2005/0272202 A1 | 12/2005 | Prall et al. | |
| 2006/0006466 A1 | 1/2006 | Iinuma | |
| 2006/0011986 A1 | 1/2006 | Yagishita | |
| 2006/0057792 A1 | 3/2006 | Mathew et al. | |
| 2006/0097319 A1 * | 5/2006 | Kim et al. | 257/353 |
| 2006/0138533 A1 | 6/2006 | Hirler et al. | |
| 2006/0157749 A1 | 7/2006 | Okuno | |
| 2006/0183286 A1 | 8/2006 | Lee | |
| 2006/0186484 A1 | 8/2006 | Chau et al. | |
| 2006/0199324 A1 | 9/2006 | Yu et al. | |
| 2006/0202266 A1 | 9/2006 | Radosavljevic et al. | |
| 2006/0226475 A1 * | 10/2006 | Yamamoto et al. | 257/330 |
| 2007/0001219 A1 | 1/2007 | Radosavljevic et al. | |
| 2007/0057325 A1 | 3/2007 | Hsu et al. | |
| 2007/0072416 A1 | 3/2007 | Grivna et al. | |
| 2007/0075351 A1 | 4/2007 | Schulz et al. | |
| 2007/0080387 A1 | 4/2007 | Liu et al. | |
| 2007/0080409 A1 | 4/2007 | Seliskar | |
| 2007/0085576 A1 | 4/2007 | Sanchez | |
| 2007/0093010 A1 | 4/2007 | Mathew et al. | |
| 2007/0099407 A1 | 5/2007 | Lu et al. | |
| 2007/0161170 A1 | 7/2007 | Orlowski et al. | |
| 2007/0218635 A1 | 9/2007 | Seliskar | |
| 2007/0221992 A1 | 9/2007 | Seliskar | |

FOREIGN PATENT DOCUMENTS

| | | |
|---|---|---|
| JP | 6291145 A | 10/1994 |
| JP | 10093093 | 4/1998 |
| JP | 10096957 | 4/1998 |
| JP | 11251433 | 9/1999 |
| JP | 2005079208 | 3/2005 |
| JP | 2005191484 | 7/2005 |
| JP | 2005294789 | 10/2005 |

OTHER PUBLICATIONS

Liu et al., "Systematic Electrical Characteristics of Ideal Rectangular Cross Section SiFin Channel Double Gate MOSFETs", IEEE Trans. On Nanotechnology, vol. 2, pp. 198-204.

Ananthan, et al., "FinFET SRAM Device and Circuit Design Considerations", Quality Electronic Design 2004 Proceedings, 5th International Symposium, pp. 511-516.

ROC (Taiwan) Patent Application No. 095144493 Search Report, Search Date Dec. 1, 2012.

* cited by examiner

TRANSISTORS WITH IMMERSED CONTACTS

CROSS REFERENCE TO RELATED APPLICATIONS

This application is a divisional of co-pending U.S. patent application Ser. No. 13/105,484, filed on May 11, 2011, which is a divisional of U.S. patent application Ser. No. 11/311,587, filed on Dec. 16, 2005, and now issued as U.S. Pat. No. 7,968,394.

TECHNICAL FIELD

The present invention relates generally to semiconductor devices, and more particularly to transistors with immersed contacts.

BACKGROUND

Figure 1:
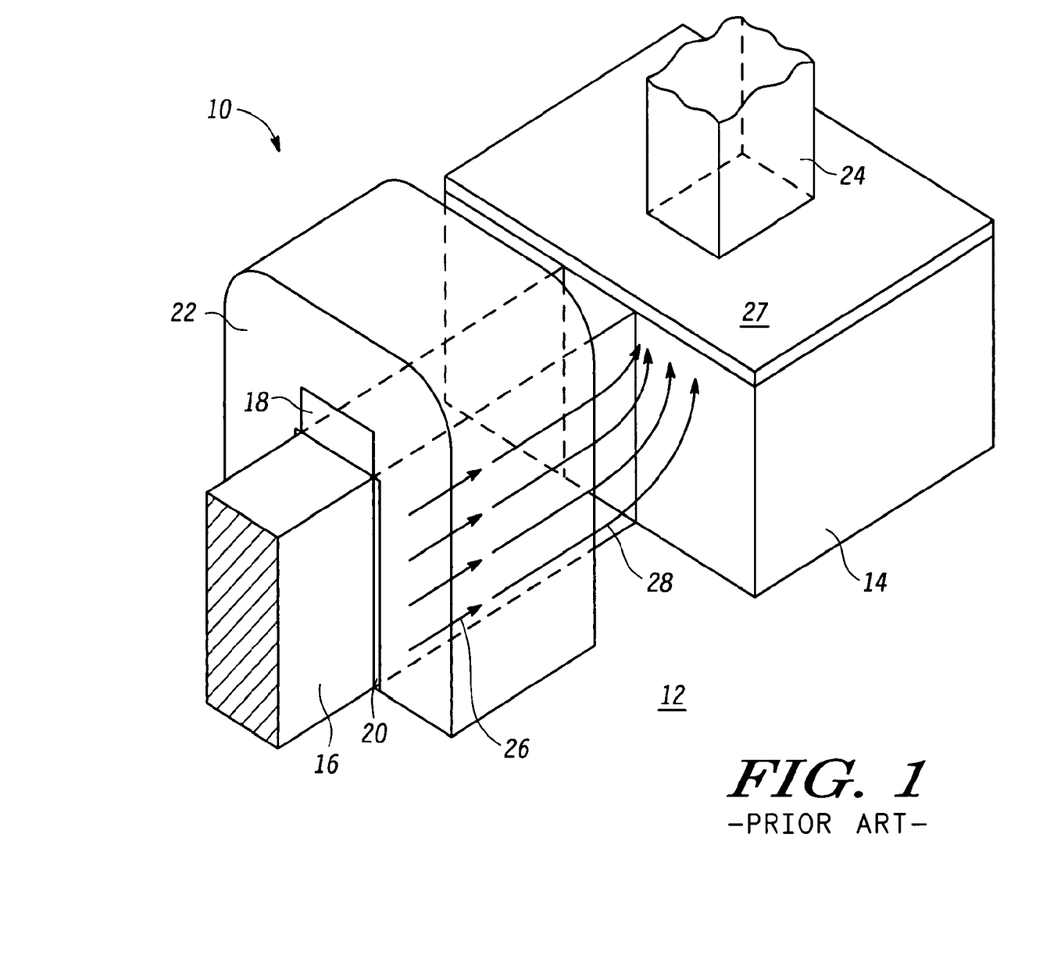
FIG. 1 is a partial perspective view of a conventional transistor.

Traditionally, contacts for connecting current electrodes to a transistor have been formed on respective surfaces of source and drain regions. Contacts formed on surfaces of source and drain regions, however, pose problems with current flow in three-dimensional devices, such as FinFET transistors or tri-gate transistors. In particular, as shown in FIG. 1, a conventional FinFET transistor 10 is shown. Conventional FinFET transistor 10 may be formed on a substrate layer, such as oxide layer 12. Conventional FinFET transistor 10 may include a source/drain structure 14, a fin 16, a fin cap 18 formed on fin 16, and a gate 22 formed on a gate dielectric 20. A source/drain contact 24 may be formed on source/drain structure 14 after a silicide layer 27 is formed on source/drain structure 14. As shown in FIG. 1, current flows along the fin's (e.g., fin 16) sidewalls as shown by directional arrows 26. The current then flows to the source/drain contact 24, as indicated by directional arrows 28. Because the source/drain contact is formed only on the surface of source/drain structure 14, current flowing along the bottom part of the fin incurs higher resistance, since it has to travel a longer path before getting to source/drain contact 24. This results in a higher effective source/drain resistance for such conventional FinFET transistors. Although FIG. 1 shows current flowing from the bottom part of fin 16 to source/drain contact 24, current also flows from a source/drain contact on the other side of fin 16 to the bottom part of fin 16. This results in additional resistance to current flows in a conventional FinFET transistor.

In addition, traditionally, gates on conventional MOSFET devices are contacted at the top of the gate electrode material, outside the active region. However, as gate thickness is being reduced, the gate resistance is becoming a problem. In particular, in many instances the gate electrode is a laminate of several materials. Typically, the bottom layer is a low-resistance conductor and rest of the gate is made of doped polysilicon or metal silicides. In any case, the materials forming the rest of the gate have higher resistivity. The gate contact is thus separated from the bottom layer having a low resistivity and is instead in contact with the rest of the layer having a high resistivity.

Thus, there is a need for a transistor with a lower source/drain resistance and lower gate resistance.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE EMBODIMENTS

In one aspect, a method includes forming a semiconductor structure, and forming a first contact. The step of forming the first contact includes removing a first portion of the semiconductor device electrode structure to form an opening and forming contact material in the opening, wherein the first contact is electrically coupled to the semiconductor device electrode structure. As used herein, the term "semiconductor device electrode structure" may include a device electrode structure made in part of semiconductor material, or metallic material, or any combination thereof. Furthermore, the semiconductor device electrode structure may include a gate structure, wherein the first contact may be electrically coupled to the gate structure. As used herein, the term "gate structure" may include a gate structure made in part of semiconductor material, or metallic material, or any combination thereof.

In another aspect, a semiconductor device comprises an electrode structure and a first contact, where the first contact extends into the electrode structure and is electrically coupled to the electrode structure.

In yet another aspect, a method includes forming a semiconductor structure, the semiconductor structure includes a first current electrode region, a second current electrode region, and a channel region, the channel region is located between the first current electrode region and the second current electrode region, wherein the channel region is located in a fin structure of the semiconductor structure, wherein a carrier transport in the channel region is generally in a horizontal direction between the first current electrode region and the second current electrode region. The method further includes forming a first contact, wherein forming the first contact includes: (1) removing a first portion of the semiconductor structure to form an opening, wherein the opening is in the first current electrode region; and (2) forming contact material in the opening. As used herein, the term "semiconductor structure" may include a structure made in part of semiconductor material, or metallic material, or any combination thereof.

Figure 2:
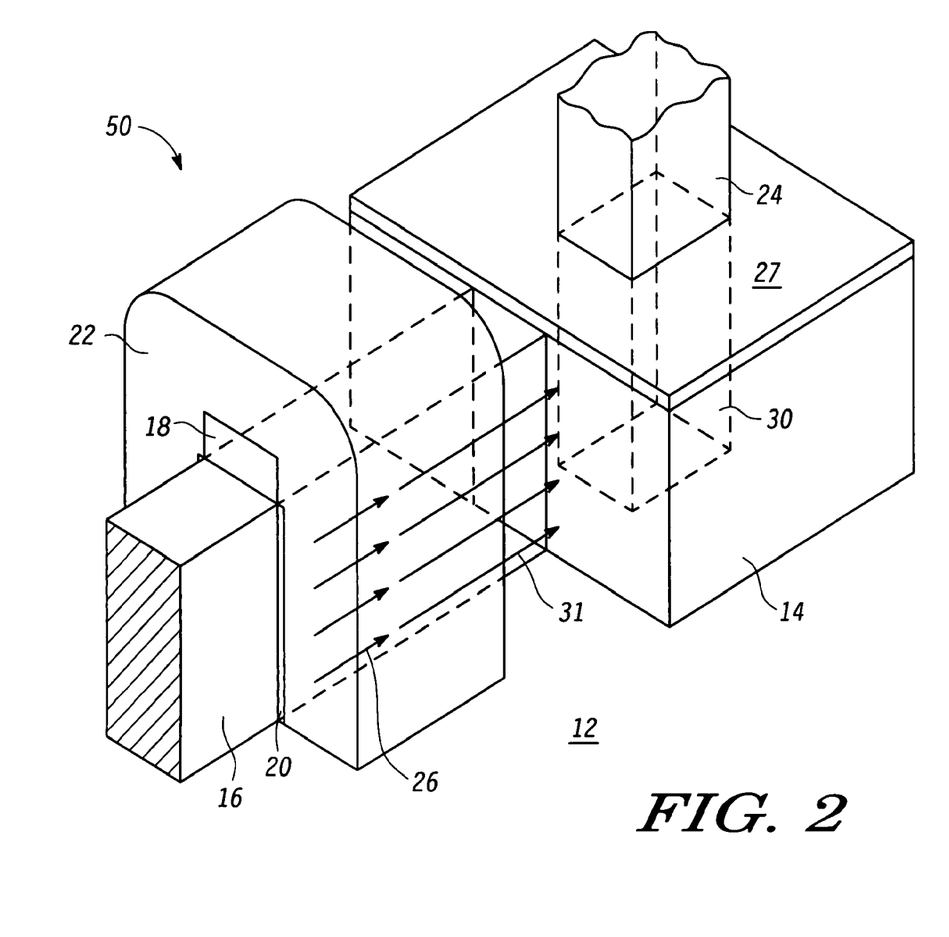
FIG. 2 is a partial perspective view of a transistor, consistent with one embodiment of the invention.

FIG. 2 is a partial perspective view of a transistor 50, consistent with one embodiment of the invention. As shown in FIG. 2, as part of transistor 50 source/drain contact 24 may be formed as an embedded source/drain contact 30, where sidewalls of the embedded source/drain contact 30 are completely surrounded by the source/drain structure 14. As a result of the embedded nature of source/drain contact, current flowing in a bottom part of fin 16 may travel in a substantially parallel path to oxide layer 20 even outside the gate, as indicated by directional arrows 31. This would result in the current flowing in the bottom part of fin 16 encountering lower resistance, which would in turn reduce the effective source to drain resistance of transistor 50. Additionally, current flowing through embedded source/drain contact 24 encounters lower resistance because of the lower resistivity of the contact material than the resistivity of the highly doped silicon. Although FIG. 2 discusses current flows in terms of source/drain contacts, other transistors consistent with other embodiments of the invention may have other types of contacts that may benefit from improved current flows. Although FIG. 2 shows a substantially rectangular embedded source/drain contact, it may be of another shape. Source/drain contact 30 may, for example be tapered with approximately a 120 nanometer width at the top and approximately a 90 nanometer width at the bottom. Additionally and/or alternatively, transistor 50 may contain additional layers or components without departing from the scope of the invention.

Figure 3:
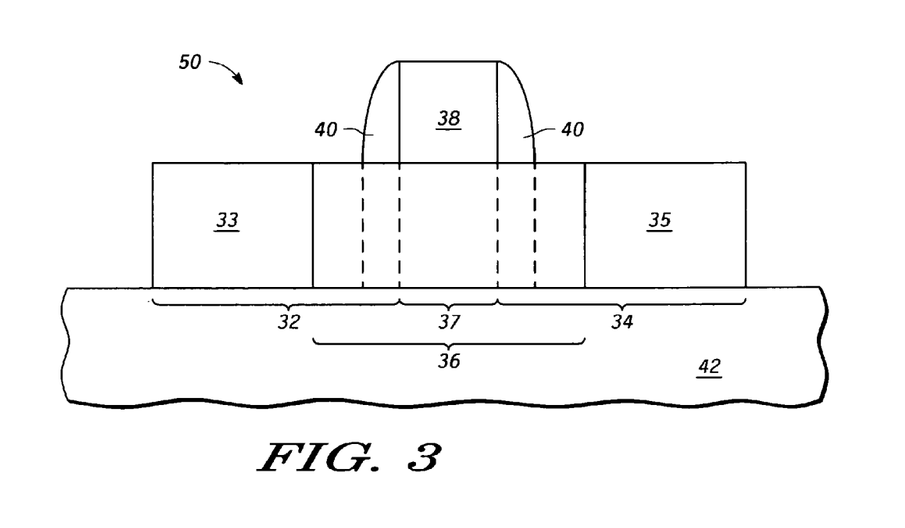
FIG. 3 is a partial cross section view of a transistor of FIG. 2 during a manufacturing step, consistent with one embodiment of the invention.

FIG. 3 is a partial cross section view of a transistor of FIG. 2 during a manufacturing step, consistent with one embodiment of the invention. As part of forming transistor 50, a source structure 33 and a drain structure 35 along with a fin 36 may be formed on an oxide 42. Although FIG. 3 shows an oxide 42, transistor 50 may be formed on any type of substrate, including, for example, silicon-on-insulator or a bulk wafer. A gate 38 may be formed as part of transistor 50. By way of example, gate 38 may be 1000 Angstroms in terms of thickness of the gate material. Gate material may be polysilicon, tantalum carbide, titanium nitride, tantalum tri-nitride, or any other suitable gate material. Gate material may also be a laminate comprising of two layers, where a first layer may be formed of tantalum carbide, tantalum nitride, or titanium nitride and a second layer may be formed of polysilicon or silicide, such as nickel silicide, titanium silicide, or cobalt silicide. By way of example, the first layer may be approximately 250 Angstroms high and the second layer may be approximately 600 Angstroms and higher. Although FIG. 3 does not show a gate dielectric, gate dielectric may be formed as part of this step, as well. Dielectric sidewall spacer 40 may be formed adjacent gate 38. Dielectric sidewall spacer 40 may be a silicon oxide or a silicon nitride spacer. As shown in FIG. 3, transistor 50 may have a source region 32, a drain region 34, and a channel region 37. Current may flow from source region 32 to drain region 34 via channel region 37. Carrier transport (for example, holes for a p-channel device and electrons for an n-channel device) may be generally in a horizontal direction between source region 32 and drain region 34. Generally, source region 32 and drain region 34 may be referred to as current electrode regions.

Figure 4:
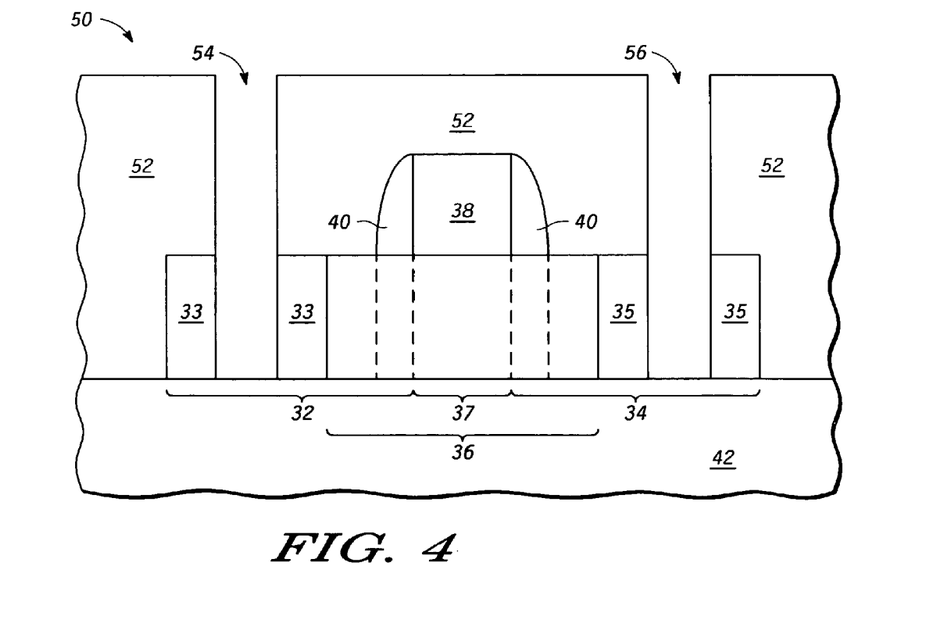
FIG. 4 is a partial cross section view of a transistor of FIG. 2 during a manufacturing step, consistent with one embodiment of the invention.
Figure 5:
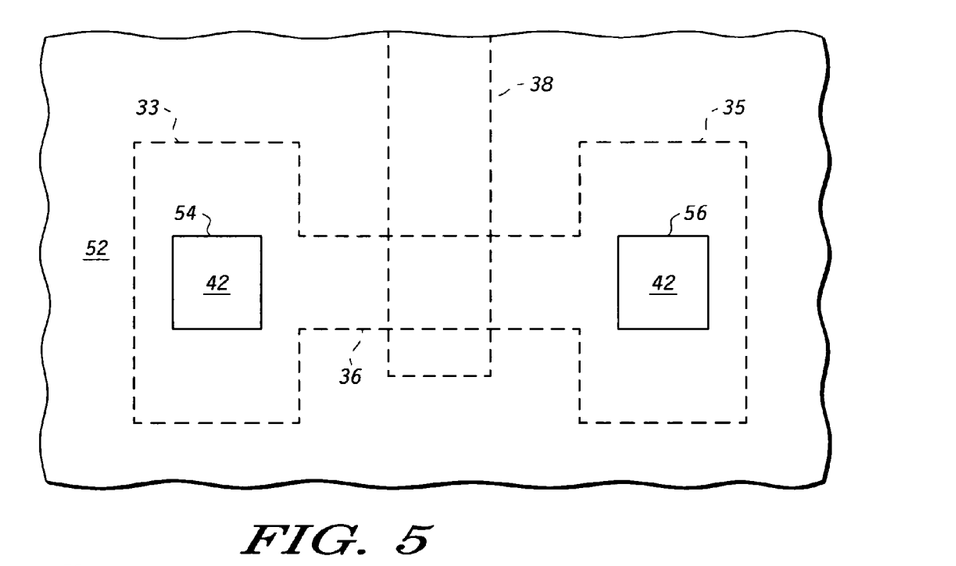
FIG. 5 is a partial top view of a transistor of FIG. 2 during a manufacturing step, consistent with one embodiment of the invention.

FIG. 4 is a partial cross section view of a transistor of FIG. 2 during a manufacturing step, consistent with one embodiment of the invention. As part of this step, a TEOS layer 52 may be formed on top of transistor 50. Contact openings 54 and 56 may then be formed in TEOS layer 52. Contact openings may be formed by removing a portion of a semiconductor structure forming transistor 50. Contact openings 54 and 56 may be formed by etching away a portion of the semiconductor structure forming transistor 50. Although FIG. 4 shows contact openings 54 and 56 extending all the way to oxide layer 42, contact openings 54 and 56 need not extend that far. Additionally and/or alternatively, contact openings 54 and 56 may not be fully enclosed or surrounded by semiconductor material forming source/drain region. FIG. 5 shows a partial top view of a transistor of FIG. 2 during this manufacturing step. Although contact openings 54 and 56 are described as being formed as part of this step, contact openings 54 and 56 may be formed when fin 36 is formed.

Figure 6:
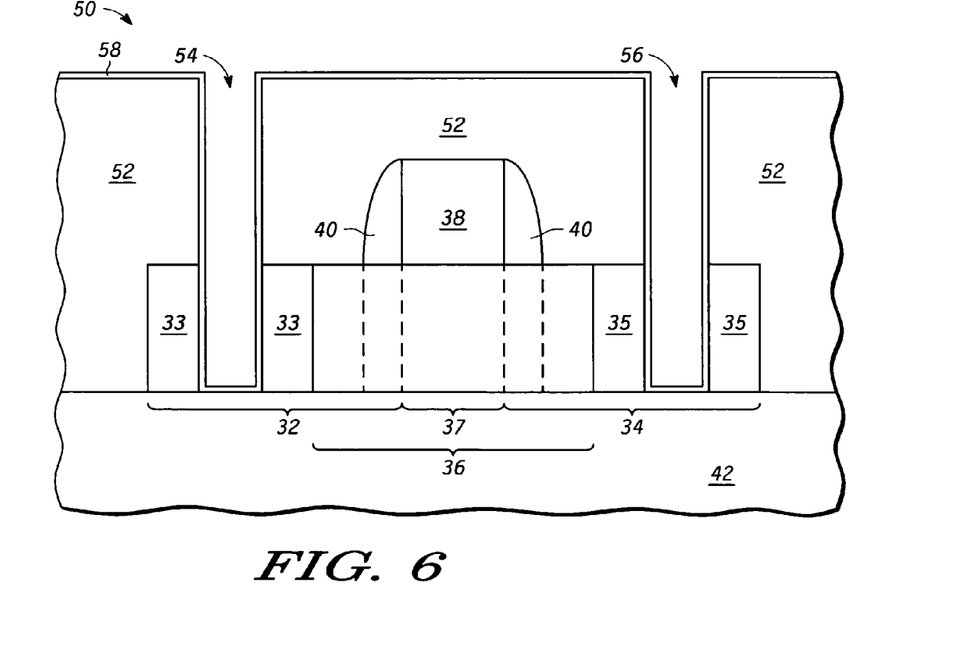
FIG. 6 is a partial cross section view of a transistor of FIG. 2 during a manufacturing step, consistent with one embodiment of the invention.
Figure 7:
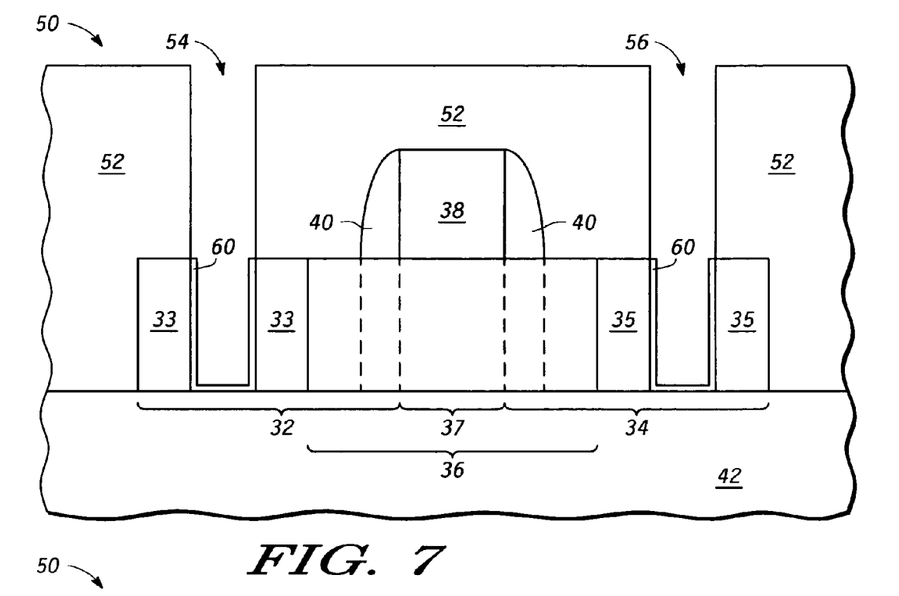
FIG. 7 is a partial cross section view of a transistor of FIG. 2 during a manufacturing step, consistent with one embodiment of the invention.
Figure 8:
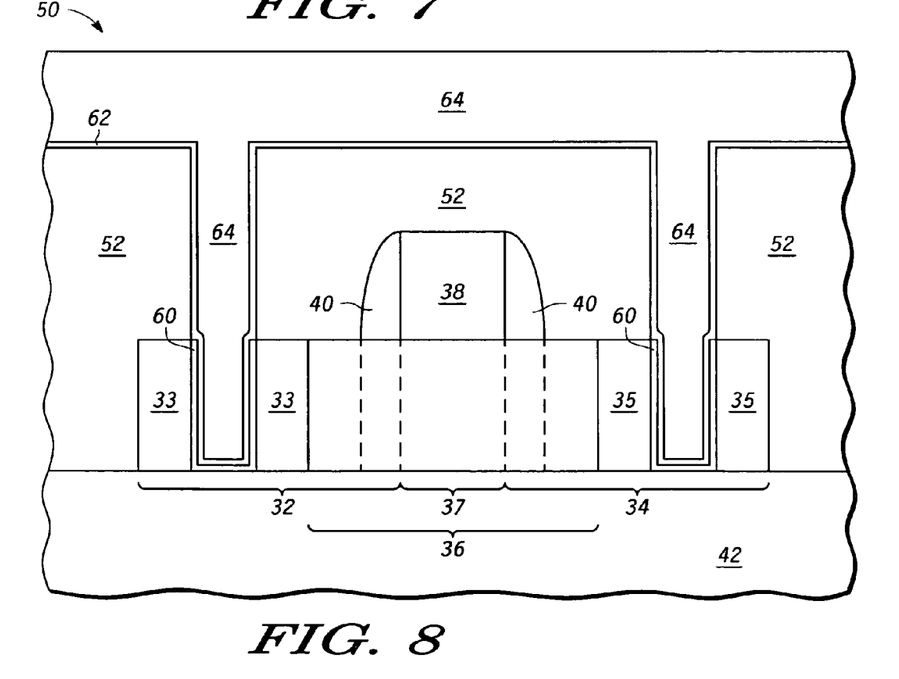
FIG. 8 is a partial cross section view of a transistor of FIG. 2 during a manufacturing step, consistent with one embodiment of the invention.
Figure 9:
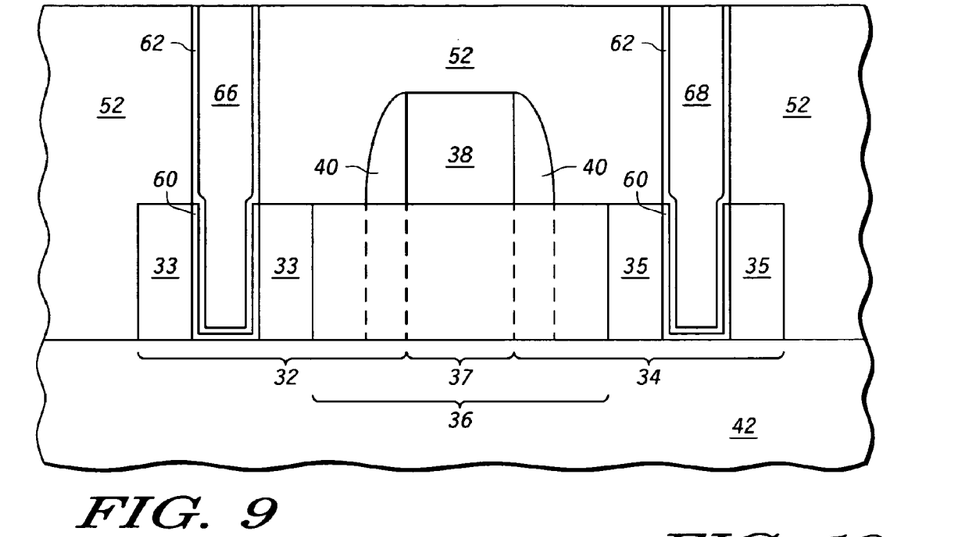
FIG. 9 is a partial cross section view of a transistor of FIG. 2 during a manufacturing step, consistent with one embodiment of the invention.

FIG. 6 is a partial cross section view of a transistor of FIG. 2 during a manufacturing step, consistent with one embodiment of the invention. After contact openings 54 and 56 are formed, a liner 58 may be formed, as shown in FIG. 6. By way of example, liner 58 may be formed using nickel, cobalt, or any other suitable material. Although liner 58 is shown as one layer, liner 58 may be formed of multiple layers. Next, as shown in FIG. 7, a silicide layer 60 may be formed on sidewalls of contact openings 54 and 56. Silicide layer 60 may be a nickel silicide layer or a cobalt silicide layer. Next, as shown in FIG. 8, a barrier layer 62 may be formed. By way of example, bather layer 62 may be formed using titanium and titanium nitride. Next, a contact material 64 may be deposited, which may be formed in contact openings 54 and 56, as well. Contact material 64 may be tungsten, copper, or any other suitable contact material. Next, as shown in FIG. 9, contact material 64 may be planarized using chemical-mechanical polishing, for example. Thus, embedded source/drain contacts 66 and 68 may be formed in transistor 50.

Figure 10:
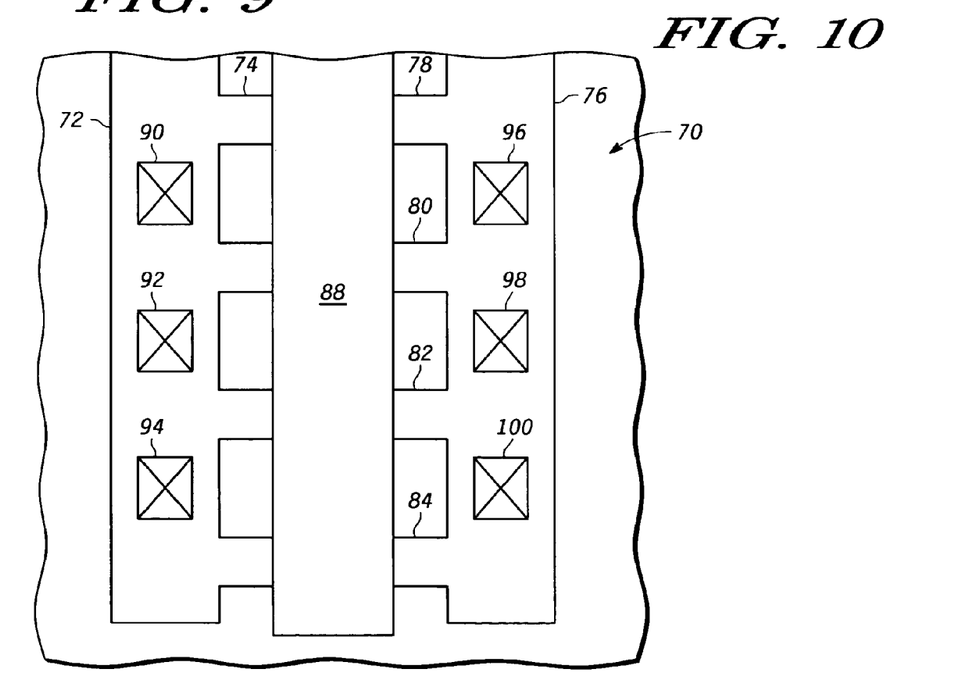
FIG. 10 is a partial top view of a multi-fin transistor, consistent with one embodiment of the invention.

FIG. 10 is a partial top view of a multi-fin transistor, consistent with one embodiment of the invention. Although the process steps above have been described with respect to a single-fin structure, a multi-fin transistor with embedded source/drain contacts may be formed, as well. Thus, as shown in FIG. 10, a transistor 70 may include a multi-fin structure 74 comprising fins 78, 80, 82, 84, which may be formed using semiconductor processing techniques. Multi-fin structure 74 may include a source structure 72 and a drain structure 76. A gate 88 may be formed, as well. Embedded source/drain contacts 90, 92, 94, 96, 98, and 100 may be formed using the processing steps described above. By way of example, each fin may be 20 nanometers wide and may be separated by a distance of 140 nanometers. Further, although FIG. 10 shows embedded/drain contacts 90, 92, 94, 96, 98, and 100 offset from fins 78, 80, 82, and 84, they may be formed in alignment with these fins, as shown in FIG. 5, for example.

Figure 11:
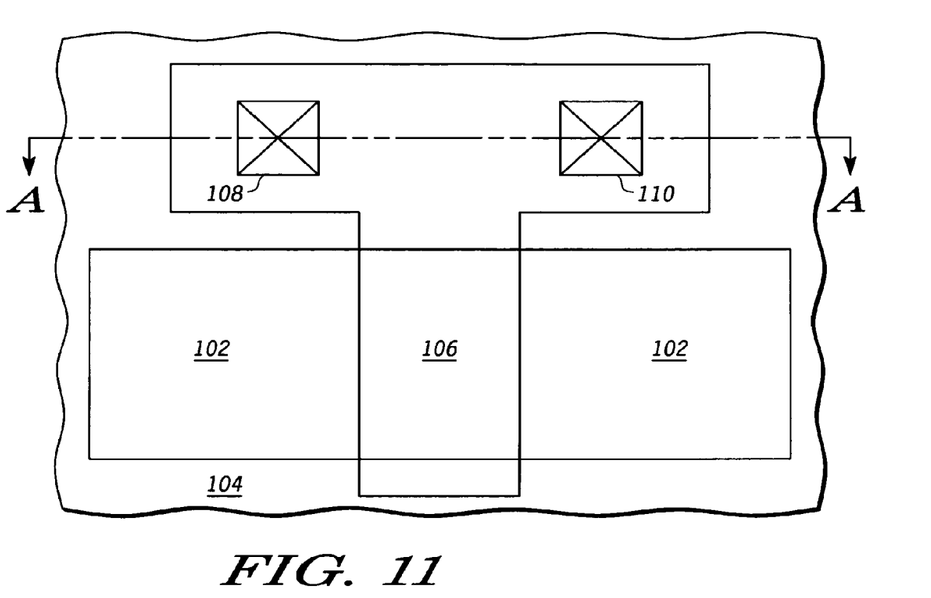
FIG. 11 is a partial top view of a planar transistor, consistent with one embodiment of the invention.
Figure 12:
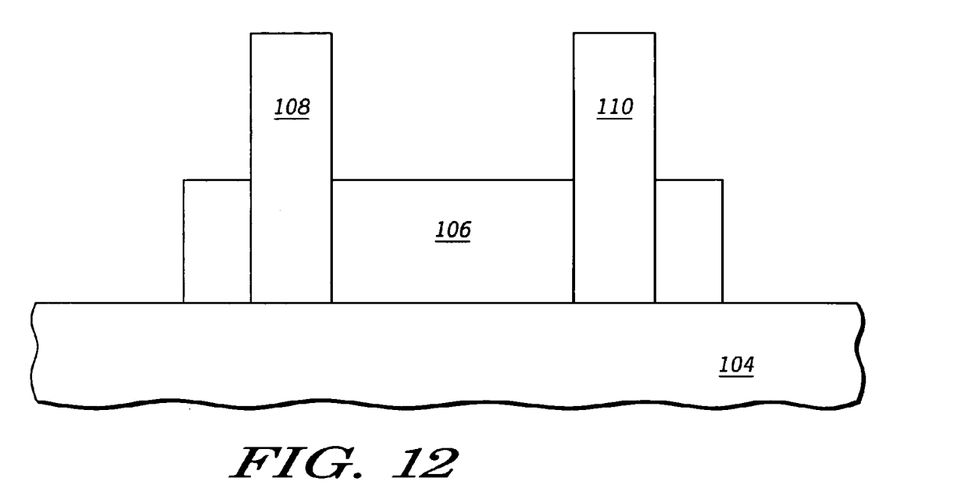
FIG. 12 is a partial cross section view of a planar transistor, consistent with one embodiment of the invention.

FIG. 11 is a partial top view of a planar transistor with embedded gate contacts. Planar transistor may have an active region 102 formed on a silicon trench isolator 104. Active region 102 may include source/drain and channel regions, for example. A gate 106 may be formed on top of active region 102. Gate contacts 108 and 110 may be formed to connect the gate material. Referring now to FIG. 12, as shown contacts 108 and 110 may be embedded. In other words, contact material forming contacts 108 and 110 may be deposited after etching the opening for the gate contacts all the way to silicon trench isolator 104. Although FIG. 12 shows gate contact material extending all the way to silicon trench isolator 104, gate contact material need not extend all the way to silicon trench isolator 104. Further, prior to depositing contact material in gate contact openings, nickel or nickel-platinum can be deposited in order to lower the Schottky contact barrier. Also, the sidewall of gate contact openings can have contact material layers on each sidewall. Additionally, although not shown, gate 106 may be a laminate of several layers. Additionally and/or alternatively, gate contact openings 108 and 110 may not be fully enclosed or surrounded by the gate material.

Figure 13:
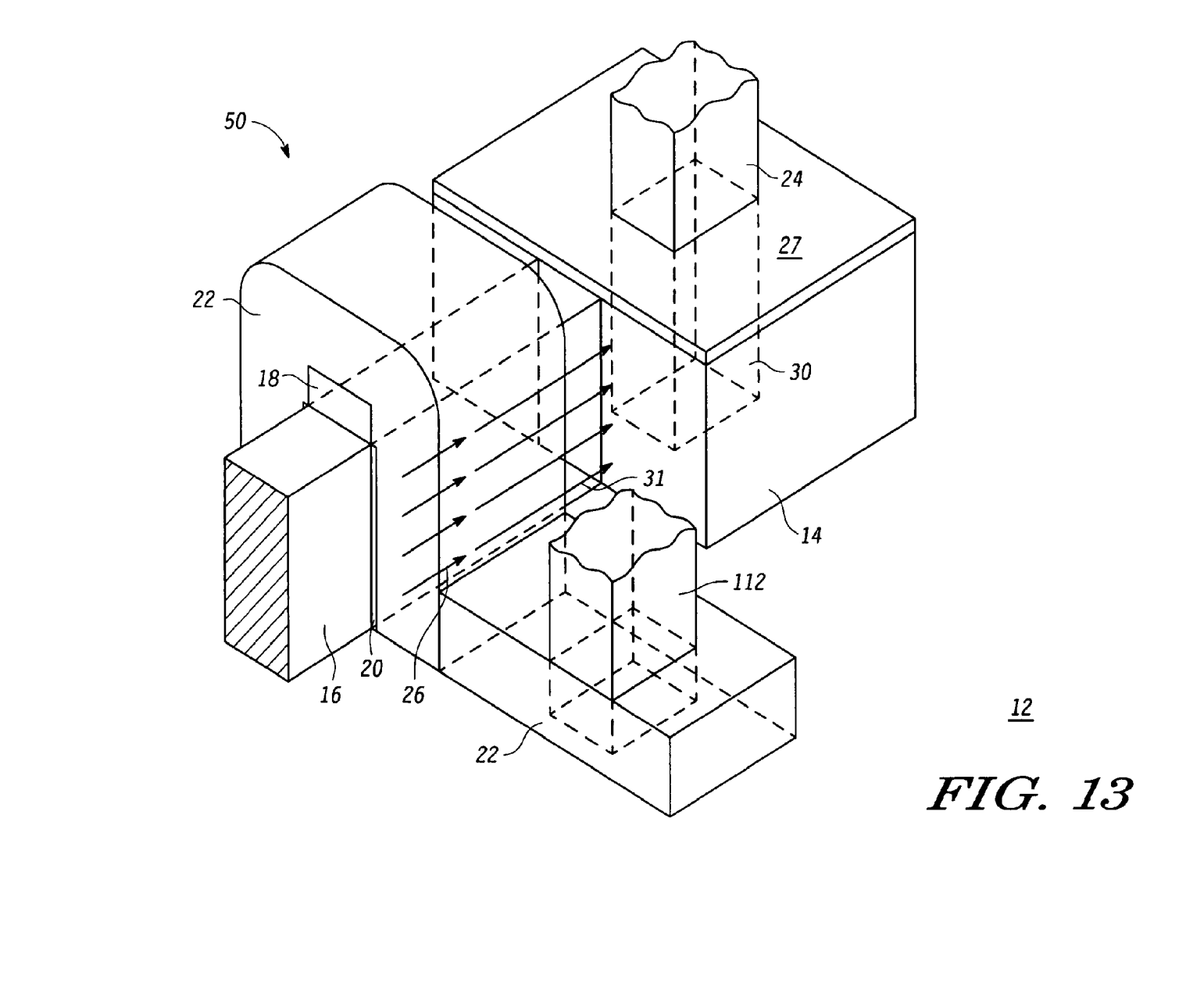
FIG. 13 is a partial perspective view of a transistor, consistent with one embodiment of the invention.

FIG. 13 shows a partial perspective view of a transistor of FIG. 2 with embedded gate contacts. In particular, as shown a gate contact 112 may be embedded into gate 22. By way of example, gate contact 112 may be embedded all the way to oxide 12, although it need not be embedded all the way. Further, prior to depositing contact material in gate contact openings, nickel or nickel-platinum can be deposited in order to lower the Schottky contact barrier. Also, the sidewall of gate contact openings can have contact material layers on each sidewall. Additionally, although not shown, gate 112 may be a laminate of several layers.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A semiconductor device comprising:
   a substrate;
   an electrode structure on the substrate, wherein the electrode structure includes a first current electrode region and an opening that extends from a top surface of the electrode structure to the substrate; and
   a first contact, wherein the first contact is formed within the opening and extends into the first current electrode region to the substrate, the first contact is electrically coupled to the first current electrode region, and sidewalls of a portion of the first contact that is present within the opening are completely surrounded by the electrode structure.

2. The semiconductor device of claim 1, wherein the first current electrode region is of a semiconductor structure, the semiconductor structure further includes:
   a second current electrode region; and
   a channel region located in the semiconductor structure between the first current electrode region and the second current electrode region, the channel region located in a fin structure of the semiconductor structure.

3. The semiconductor device of claim 2, further comprising:
   a second contact electrically coupled to the second current electrode region, the second contact extending into the second current electrode region of the semiconductor structure.

4. The semiconductor device of claim 2, wherein:
   the first semiconductor structure includes a plurality of fin structures;
   the plurality of fin structures includes the fin structure;
   each of the plurality of fin structures includes a channel region;
   each of the plurality of fin structures is located between a first structure of the semiconductor structure and a second structure of the semiconductor structure;
   at least a portion of the first current electrode region is located in the first structure and at least a portion of the second current electrode region is located in the second structure; and
   the first contact extends into the first structure.

5. The semiconductor device of claim 1, wherein the electrode structure is located on an insulator, and the first contact extends to the insulator.

6. The semiconductor device of claim 1, wherein the first contact includes a barrier layer.

7. The semiconductor device of claim 1, wherein the first contact extends into an opening of the electrode structure, the opening having a sidewall, wherein the sidewall includes a silicide located thereon, wherein the silicide is in electrical contact with the first contact.

8. A semiconductor device comprising:
   a semiconductor structure on a substrate, wherein the semiconductor structure comprises a first current electrode region, a second current electrode region, and a fin structure between the first current electrode region and the second current electrode region, wherein a channel region is located in the fin structure;
   a gate structure formed over the fin structure and the substrate; and
   a first contact within a first opening in the first current electrode region that extends to the substrate, wherein sidewalls of a portion of the first contact located within the first opening are completely surrounded by the first current electrode region, and the first contact is electrically coupled to the first current electrode region.

9. The semiconductor device of claim 8, further comprising:
   a second contact within the second current electrode region, wherein sidewalls of a portion of the second contact located within a second opening in the second current electrode region are completely surrounded by the second current electrode region, and the second contact is electrically coupled to the second current electrode region.

10. The semiconductor device of claim 9, further comprising:
    a third contact within the gate structure, wherein sidewalls of a portion of the third contact located within a third opening in the gate structure are completely surrounded by the gate structure, and wherein the third contact is electrically coupled to the gate structure.

11. The semiconductor device of claim 8, wherein the first current electrode region is a source region.

12. The semiconductor device of claim 8, wherein the first current electrode region is a drain region.

13. A semiconductor device comprising:
a gate structure on a substrate;
a first current electrode region on the substrate;
a first contact formed in an opening in the first current electrode region that extends to the substrate, wherein sidewalls of a portion of the first contact located within the first current electrode region are completely surrounded by the first current electrode region, and wherein the first contact is electrically coupled to the first current electrode region;
a second current electrode region; and
a channel region between the first current electrode region and the second current electrode region, wherein the channel region is located in a fin structure, and wherein the gate structure overlies the fin structure.

14. The semiconductor device of claim 13, wherein the substrate is an insulator.

15. The semiconductor device of claim 13, wherein the first contact has a cross-sectional shape selected from a group consisting of a rectangular cross-sectional shape, and a tapered cross-sectional shape having a first width at a top of the first contact and a second width at a bottom of the first contact.

16. The semiconductor device of claim 13, further comprising:
a second contact within the second current electrode region, wherein sidewalls of a portion of the second contact located within an opening in the second current electrode region are completely surrounded by the second current electrode region, and the second contact is electrically coupled to the second current electrode region.

17. The semiconductor device of claim 16, wherein the first current electrode region is a source region, and the second current electrode region is a drain region.

* * * * *